(12) United States Patent
Yamagami

(10) Patent No.: US 6,762,971 B2
(45) Date of Patent: Jul. 13, 2004

(54) SEMICONDUCTOR MEMORY DEVICE

(75) Inventor: Yoshinobu Yamagami, Nagaokakyo (JP)

(73) Assignee: Matsushita Electric Industrial Co., Osaka (JP)

( * ) Notice: Subject to any disclaimer, the term of this patent is extended or adjusted under 35 U.S.C. 154(b) by 0 days.

(21) Appl. No.: 10/430,050

(22) Filed: May 6, 2003

(65) Prior Publication Data

US 2003/0210566 A1 Nov. 13, 2003

(30) Foreign Application Priority Data

May 13, 2002 (JP) ........................................ 2002-137725

(51) Int. Cl.[7] ................................................. G11C 8/00
(52) U.S. Cl. .................... 365/230.06; 365/200; 365/203
(58) Field of Search ................................. 365/202, 203, 365/200, 230.06

(56) References Cited

U.S. PATENT DOCUMENTS

| 4,905,194 | A | * | 2/1990 | Ohtsuka et al. | ........ 365/185.23 |
|---|---|---|---|---|---|
| 5,371,712 | A | * | 12/1994 | Oguchi et al. | ......... 365/230.06 |
| 5,648,933 | A | * | 7/1997 | Slemmer | ..................... 365/200 |
| 5,825,699 | A | | 10/1998 | Tanaka | |
| 5,889,711 | A | * | 3/1999 | Yang et al. | .................. 365/200 |
| 6,172,934 | B1 | * | 1/2001 | Uchihira | ................ 365/230.06 |

FOREIGN PATENT DOCUMENTS

JP          11213690 A       8/1999

* cited by examiner

Primary Examiner—Son Mai
(74) Attorney, Agent, or Firm—Akin Gump Strauss Hauer & Feld, L.L.P.

(57) ABSTRACT

A semiconductor memory device comprises plural word lines including one or more redundant word lines, plural pairs of bit lines, plural memory cells connected to the plural word lines and the plural pairs of bit lines, plural word-line drivers which are connected to one ends of the plural word lines and controlled by plural word-line control signals respectively, and plural word-line control elements which are connected to other ends of the plural word lines and controlled by a control signal activated at the precharge of the bit lines.

6 Claims, 9 Drawing Sheets

SEMICONDUCTOR MEMORY DEVICE

BACKGROUND OF THE INVENTION

The present invention relates to a semiconductor memory device having a redundancy repair circuit.

In general, a semiconductor memory device such as a static random access memory (SRAM) and a dynamic random access memory (DRAM) places an auxiliary memory cell array in addition to a regular memory cell array in order to improve its yield. When it is determined that a defective memory cell exists in the regular memory cell array in the testing process of the semiconductor memory device, the defective memory cell is replaced with the auxiliary memory cell, thereby to complete the semiconductor memory device as a non-defective unit. That is, so-called redundancy repair is performed.

The technology of a prior art semiconductor memory device will be explained below.

FIG. 7 is a configuration view of the prior art semiconductor memory device (SRAM). The semiconductor memory device in FIG. 7 has memory cells 1, word-line drivers 2, a redundant word-line driver 3, a bit-line precharge control signal line driver 4, bit-line precharge circuits 5, word lines WL1 and WL2, a redundant word-line RWL, pairs of bit lines BL1, /BL1 and BL2, /BL2, and a bit-line precharge control signal line PCGL.

WLCG1 to WLCG 3 and PCG designate word-line control signals and a bit-line precharge control signal, respectively, and mark A indicates a break in the word line.

The word-line drivers 2 are buffers connected to the respective word lines WL1, WL2 and transmit the respective word-line control signals WLCG1, WLCG2 inputted to each memory cell 1 through the respective word lines WL1, WL2.

The redundant word-line driver 3 is a buffer connected to the redundant word-line RWL, and in the case where a defect exists in the word line WL1 or WL2, the driver 3 transmits the inputted word-line control signal WLCG3 to each memory cell 1 through the redundant word-line RWL.

The bit-line precharge control signal line driver 4 is a buffer connected to the bit-line precharge control signal line PCGL, outputs the inputted bit-line precharge control signal PCG to the bit-line precharge control signal line PCGL and activates or deactivates the bit-line precharge circuits 5.

Each memory cell 1 is connected to a word line (including a redundant word line) and a pair of bit lines.

FIG. 8 is a circuit diagram showing the specific configuration of the memory cell 1. In FIG. 8, Q1 and Q2 are access transistors, Q3 and Q4 are drive transistors, Q5 and Q6 are load transistors, WL is a word line, BL and /BL are a pair of bit lines, and VDD is a power source terminal.

Gate terminals of the access transistors Q1 and Q2 are connected to the word line WL or the redundant word line RWL and drain terminals thereof are connected to the pair of bit lines BL and /BL, respectively.

The drive transistor Q3 and the load transistor Q5 form a first inverter and the drive transistor Q4 and the load transistor Q6 form a second inverter.

An output terminal of the first inverter is connected to an input terminal of the second inverter and an output terminal of the second inverter is connected to an input terminal of the first inverter so that a latch circuit is constituted. The latch circuit stores and holds data. When the word line WL or redundant word line RWL becomes H level, the memory cells 1 connected to the line output data stored therein to the pair of bit lines BL and /BL or receive complementary signals (data) transmitted through the pairs of bit lines BL and /BL.

FIG. 9 is a circuit diagram showing the specific configuration of the bit-line precharge circuit 5. In FIG. 9, Q7 and Q8 are precharge transistors, Q9 is an equalize transistor, BL and /BL are a pair of bit lines, PCGL is a bit-line precharge control signal line, and VDD is a power source terminal.

Each gate terminal of the precharge transistors Q7, Q8 and the equalize transistor Q9 are connected to the bit-line precharge control signal line PCGL and receives input of the bit-line precharge control signal. Drain terminals of the precharge transistors Q7 and Q8 are connected to the pair of bit lines BL and /BL, respectively and source terminals are connected to the power source terminal VDD. The source terminal and drain terminal of the equalize transistor Q9 are connected to the pair of bit lines BL and /BL, respectively.

When the bit-line precharge control signal PCG is L level, the bit-line precharge circuit 5 becomes activated and precharges pairs of bit lines BL1, /BL and BL2, /BL2. When the bit-line precharge control signal PCG is H level, the bit-line precharge circuit 5 becomes deactivated and goes into a high impedance state.

Operations of the semiconductor memory device thus constituted will be described below. Firstly, the case where no break A occurs in the word line will be explained.

When all of the word-line drivers 2 and the redundant word-line driver 3 output the word-line control signals WLCG1 to WLCG3 of L level, all memory cells 1 go into a high impedance state (the state in which data input/output is not performed). At that time, the bit-line precharge control signal PCG (output signal of the bit-line precharge control signal line driver 4) becomes L level and the bit-line precharge circuit 5 goes into an activated state. All pairs of bit lines BL and /BL are precharged to H level (VDD level) by the bit-line precharge circuits 5.

Next, when the bit-line precharge control signal PCG becomes H level, the bit-line precharge circuits 5 go into a deactivated state (high-impedance state).

When any one of all of the word-line drivers 2 and the redundant word-line driver 3 outputs H level, the memory cell 1 to which H level is inputted through the word line WL or RWL becomes activated (writing or reading of data is carried out). In the memory cell 1 which receives input of the word-line control signal WLCG of H level, gates of the access transistors Q1 and Q2 turns ON and writing or reading data to/from the latch circuit Q3 to Q6 is performed through the pair of bit lines BL and /BL connected to the access transistors Q1 and Q2, respectively.

When writing or reading data to/from the memory cell 1 is completed, the word-line control signal WLCG returns to L level from H level and the memory cell 1 goes into a high impedance state. The bit-line precharge control signal PCG becomes L level again and the bit-line precharge circuits 5 are activated, so that the pairs of bit lines BL and /BL are precharged to H level. Subsequently, the above-mentioned processing is repeated.

Next, the case where a break A occurs in the word line will be explained.

Suppose that a break occurs at the point indicated as A in FIG. 7. Even if the word-line driver 2 transmits the word-line control signal of H level through the word line WL1 with the break, it is impossible to properly write and read data to/from the memory cell connected to the word line WL1 on the right side from the break point A.

In such a case, by performing redundancy repair generally according to the below-mentioned method, a non-defective semiconductor memory device is achieved. The word line WL1 with the break is made to L level (the input terminal of the word line driver 2 connected to the word-line WL1 is grounded) and all memory cells 1 connected to the word line WL1 are made to be in a high impedance state. The word-line control signal WLCG which were inputted to the word-line driver 2 of the word line WL1 if it were not for the break is inputted to the redundant word-line driver 3. The redundant word-line driver 3 transmits the word-line control signal WLCG to the memory cells 1 through the redundant word line RWL, whereby that writing or reading data is performed in the memory cells 1 connected to the redundant word line RWL. By replacing the memory cells 1 connected to the word line WL1 having the break with the memory cells 1 connected to the redundant word line RWL, the semiconductor memory device can perform proper writing and reading of data.

However, the above-mentioned conventional configuration has problems as stated below.

In FIG. 7, even if an input terminal of the word-line driver 2 connected to the word line WL1 with the break is ground level, the word line WL1 on the right side from the break point A remains in a floating state. In the case where the potential of the word line WL1 in a floating state equals the gate threshold of the access transistors Q1 and Q2 of the memory cell 1 or greater, all the memory cell 1 connected to the word line on the right side from the break point A is always in an activated state (the state in which writing or reading of data is always performed at all times).

Even if the memory cells connected to the word line WL1 with the break are replaced with memory cells connected to the redundant word line RWL, there is a possibility that the memory cell 1 connected to the word line in a floating state remains activated in the memory cell array. In the case where normal word lines other than the word line WL1 with the break (the word line WL2 and the redundant word line RWL in FIG. 7) become H level, data conflict between the memory cells 1 which are connected to the word line WL1 in a floating state and remain activated and the memory cells 1 which are connected to the normal word line and become activated according to the word-line control signal may occur through the pair of bit lines (BL2 and /BL2 in FIG. 7), resulting in damaging data of memory cells 1 connected to the normal word line.

Further, during the period when the bit-line precharge control signal PCG becomes L level and the pairs of bit lines are precharged to H level, the problem arises that a pass-through current flows between the memory cell connected to the word line in a floating state and the bit-line precharge circuit. The above-mentioned example is the case where the break occurs in the word line, the same problem also arises when the break occurs in the redundant word line.

BRIEF SUMMARY OF THE INVENTION

The present invention solves the above-mentioned conventional problems and object thereof is to provide a semiconductor memory device capable of performing redundancy repair of defect in the word line due to break more securely.

A semiconductor memory device according to the present invention from one aspect comprises plural word lines including one or more redundant word lines, plural pairs of bit lines, plural memory cells connected to the plural word lines and the plural pairs of bit lines, plural word-line drivers which are connected to one ends of the plural word lines and controlled by plural word-line control signals respectively, and plural word-line control elements which are connected to other ends of the plural word lines and controlled by a control signal activated at the precharge of the bit lines.

In the above-mentioned semiconductor memory device according to the present invention from another aspect, the plural word-line control elements are controlled by a precharge control signal and a redundant selection signal.

In the above-mentioned semiconductor memory device according to the present invention from another aspect, the plural word-line control elements are formed by using elements of dummy memory cells disposed on the periphery of a memory cell array which consists of the plural memory cells.

A semiconductor memory device according to the present invention from another aspect comprises plural word lines including one or more redundant word lines, plural pairs of bit lines, plural memory cells connected to the plural word lines and the plural pairs of bit lines, plural word-line drivers which are connected to one ends of the plural word lines and controlled by plural word-line control signals respectively, plural first word-line control elements which are connected to other ends of the plural word lines respectively and controlled by a control signal activated at the precharge of said bit lines, and plural second word-line control elements which are connected to any points other than both ends of said plural word lines and controlled by a control signal activated at the precharge of the bit lines.

In the above-mentioned semiconductor memory device according to the present invention from another aspect, the plural first word-line control elements and the plural second word-line control elements are controlled by a precharge control signal and a redundant selection signal.

In the above-mentioned semiconductor memory device according to the present invention from another aspect, the plural first word-line control elements and the plural second word-line control elements are formed by using elements of dummy memory cells disposed on the periphery of a memory cell array which consists of the plural memory cells.

With the above-mentioned configuration, in the semiconductor memory device, the word-line control elements which are controlled by a control signal activated at the precharge of bit lines are connected to the far ends of all word lines including the redundant word line (the end opposite to connecting end with the word-line driver, the other end). The word-line control element causes all word lines to be the level in which the memory cell becomes a deactivated state during the precharge period of the pair of bit lines. The word-line control element becomes high-impedance state during the period other than the precharge period of the pair of bit lines. Accordingly, data conflict between the memory cells connected to the word line with the break defect and the memory cells connected to the normal word line via the pair of bit lines is prevented from occurring, and a pass-through current is prevented from flowing between the memory cell connected to the word line in which the break defect occurs and the bit-line precharge circuit during the period when the pair of bit lines are precharged. This enables to securely repair defect of word line due to break in the semiconductor memory device by using redundancy method.

In the semiconductor memory device according to an additional aspect of the present invention, in the absence of break defect in the word line, change in the bit-line precharge control reverse signal is eliminated by controlling the word-line control element with the redundant selection signal. This prevents flow of any charging and discharging current of the bit-line precharge control reverse signal, thereby achieving lower power consumption in the semiconductor memory device.

Further, it is possible to suppress increase in layout area of the semiconductor memory device by constituting the word-line control element with the dummy memory cell. Preferably, by means of only modification of aluminum wiring without changing pattern of semiconductor substrate, the element of the dummy memory cell is used as the bit-line control element. This causes no bad influence in processing the shape of the memory cell array when the element of the dummy memory cell is transformed to the bit-line control element.

Furthermore, the word-line control element which is controlled by the control signal activated at the precharge of the bit lines is connected to far ends (the end opposite to the connecting end with the word-line driver, other end) and any points other than the far ends of all word lines including the redundant word line. Thereby, data conflict between the memory cell connected to a word line with the break defect at plural points and the memory cell connected to the normal word line via the pair of bit lines is prevented from occurring, and a pass-through current between the memory cell connected to the word line in which the break defect at plural points and the bit-line precharge circuit is prevented from flowing during the period when the pair of bit lines are precharged. This enables to improve the probability of being able to repair defect of word line due to break in the semiconductor memory device.

Furthermore, in the absence of break defect in the word line, change in the bit-line precharge control reverse signal is eliminated by controlling the word-line control element with the redundant selection signal. This prevents flow of any charging and discharging current of the bit-line precharge control reverse signal, thereby achieving lower power consumption in the semiconductor memory device.

Furthermore, it is possible to suppress increase in layout area of the semiconductor memory device by constituting the word-line control element with the dummy memory cell.

The novel features of the invention are set forth with particularity in the appended claims. The invention as to both structure and content, and other objects and features thereof will best be understood from the detailed description when considered in connection with the accompanying drawings.

Part or all of the drawings are drawn schematically for diagrammatic representation and it should be considered that they do not necessarily reflect relative size and position of components shown therein.

DETAILED DESCRIPTION OF THE INVENTION

Embodiments 1 to 5 as preferred embodiments of the semiconductor memory device according to the present invention will be described below.

<<Embodiment 1>>

Figure 1:
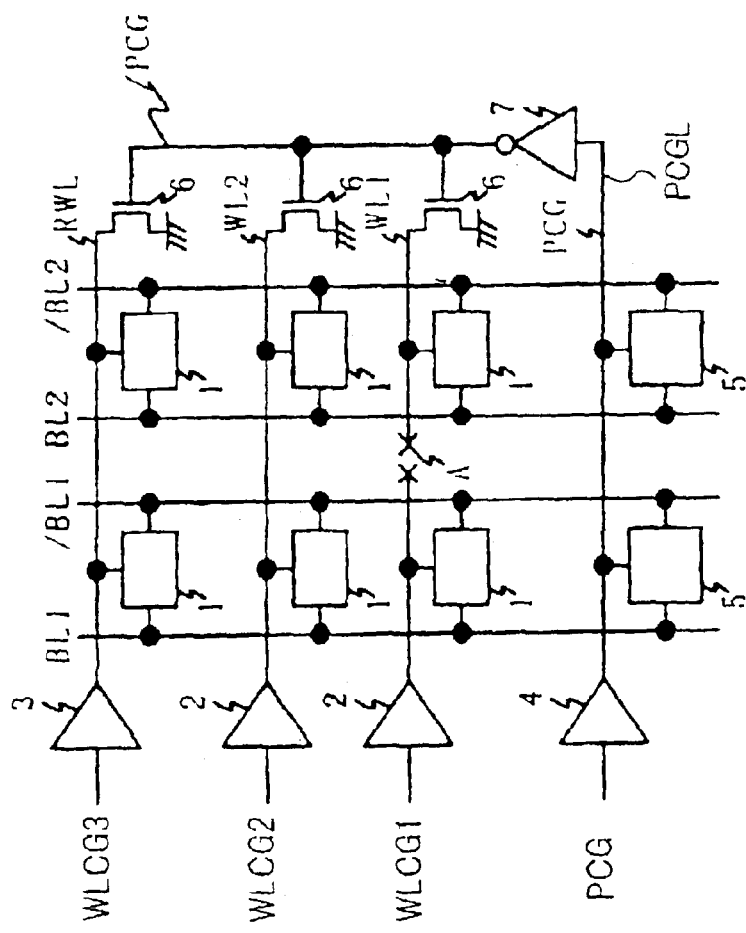
FIG. 1 is a configuration view of a semiconductor memory device of Embodiment 1 according to the present invention.

FIG. 1 shows a configuration view of a semiconductor memory device (SRAM) of Embodiment 1 according to the invention.

The semiconductor memory device shown in FIG. 1 has memory cells 1, word-line drivers 2, a redundant word-line driver 3, a bit-line precharge control signal line driver 4, bit-line precharge circuits 5, word-line control elements 6, an inverter 7, word lines WL1 and WL2, a redundant word-line RWL, pairs of bit lines BL1, /BL1 and BL2, /BL2, and a bit-line precharge control signal line PCGL.

WLCG1 to WLCG 3, PCG and /PCG designate word-line control signals, a bit-line precharge control signal and a bit-line precharge control reverse signal, respectively, and mark A indicates a break in the word line.

The word-line drivers 2 are buffers connected to one ends of the respective word lines WL1, WL2 and transmit the respective word-line control signals WLCG1, WLCG2 inputted to each memory cell 1 through the respective word lines WL1, WL2.

The redundant word-line driver 3 is a buffer connected to one end of the redundant word-line RWL and transmits the inputted word-line control signal WLCG3 to each memory cell 1 through the redundant word-line RWL.

The bit-line precharge control signal line driver 4 is a buffer connected to the bit-line precharge control signal line PCGL, outputs the inputted bit-line precharge control signal PCG to the bit-line precharge control signal line PCGL and activates or deactivates the bit-line precharge circuits 5. Each memory cell 1 is connected to one of the word lines WL and a redundant word line RWL and a pair of bit lines.

The inverter 7 receives input of the bit-line precharge control signal PCG and transmits the bit-line precharge control reverse signal /PCG as a reverse signal to each word-line control element 6.

When the bit-line precharge control signal PCG is L level (the bit-line precharge control reverse signal /PCG is H level), the word-line control elements 6 (FET (Field Effect Transistor) in this embodiment) connected to the other ends (ends opposite to one ends of the word lines and the redundant word line to which the word-line drivers 2 and the redundant word-line driver 3 are connected, far ends) of all word lines WL1, WL2 and the redundant word line RWL make respective word lines WL1, WL2 and redundant word line RWL be L level. When the bit-line precharge control signal PCG is H level (the bit-line precharge control reverse signal /PCG is L level), the word-line control elements 6 go into a high-impedance state.

Figure 8:
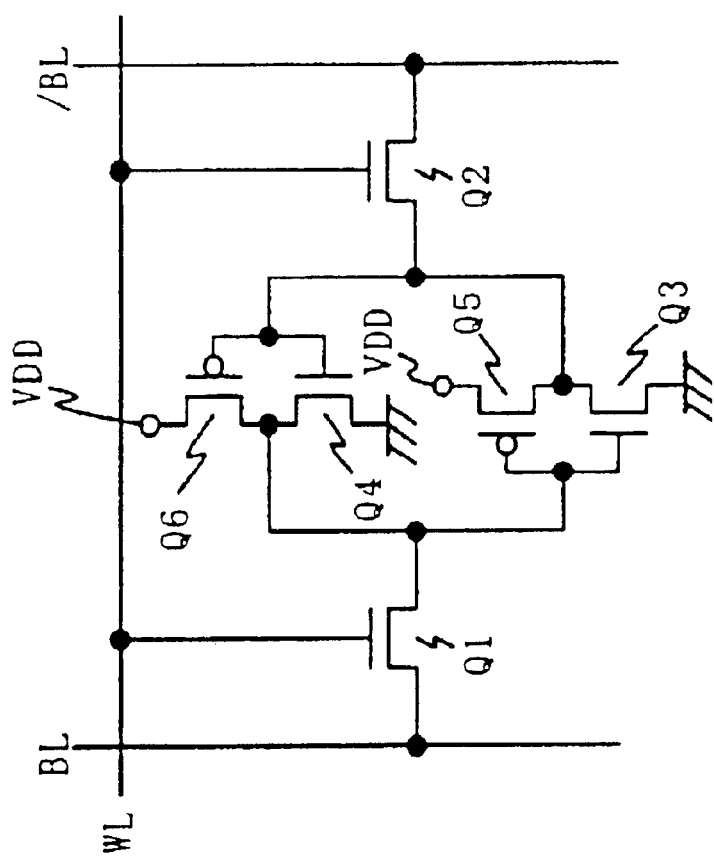
FIG. 8 is a circuit diagram showing a specific configuration of a memory cell.
Figure 9:
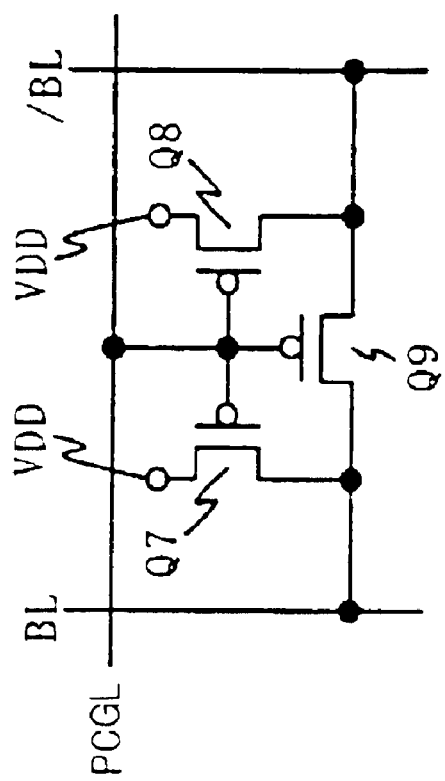
FIG. 9 is a diagram showing a specific configuration of a bit-line precharge circuit.

FIG. 8 is a circuit diagram showing the specific configuration of the memory cell 1, and FIG. 9 shows a diagram showing the specific configuration of the bit-line precharge circuit 5. They are same as those in the prior art and therefore descriptions thereof are omitted.

Operations of the semiconductor memory device constituted as mentioned above will be described below.

Firstly, the case where no break occurs in the word line will be explained.

When all of the word-line drivers 2 and the redundant word-line driver 3 output the word-line control signals WLCG1 to WLCG3 of L level, all memory cells 1 go into a high impedance state (the state in which data input/output is not performed). Next, the bit-line precharge control signal PCG (output signal of the bit-line precharge control signal line driver 4) becomes L level and the bit-line precharge circuit 5 goes into an activated state. All pairs of bit lines BL and /BL are precharged to H level (VDD level) by the bit-line precharge circuits 5. At this time, the bit-line precharge control reverse signal /PCG becomes H level by the inverter 7 and gates of all word-line control elements 6 turn ON so that all of the word lines WL1, WL2 and redundant word line RWL are made to be L level. At this time, all of the word-line drivers 2 and the redundant word-line driver 3 output L level (these output signal do not compete). Therefore, output of word-line control elements 6 do not conflict with those of the word-line drivers 2 and the redundant word-line driver 3.

Next, when the bit-line precharge control signal PCG becomes H level, all bit-line precharge circuits 5 go into a deactivated state (high-impedance state). When any one of all word-line drivers 2 and the redundant word-line driver 3 outputs H level, the memory cells 1 which receive input of H level through the word line WL or the redundant word line RWL become activated. At this time, since the bit-line precharge control reverse signal /PCG becomes L level, gates of the word-line control elements 6 connected to all of the word lines including the redundant word line turn OFF (high-impedance state). Therefore, the word-line control elements 6 do not interfere writing or reading data to/from the activated memory cells 1 through the word line WL or redundant word line RWL. In the memory cell 1 which receives input of the word-line control signal WLCG of H level, gates of the access transistors Q1 and Q2 turn ON and writing or reading data to/from the latch circuits Q3 to Q6 is performed through the pair of bit lines BL and /BL connected to the access transistors Q1 and Q2, respectively.

When writing or reading data to/from the memory cell 1 is completed, the word-line control signal of H level returns to L level and all memory cells 1 goes into a deactivated state (high-impedance state). The bit-line precharge control signal PCG becomes L level again and the bit-line precharge circuits 5 are activated, so that all pairs of bit lines BL and /BL are precharged to H level (VDD level). At this time, the bit-line precharge control reverse signal /PCG becomes H level, gates of the word-line control elements 6 turn ON, and all of the word line WL1, WL2 and the redundant word line RWL are made to be L level. At this time, all of the word-line drivers 2 and the redundant word-line driver 3 also output L level. Therefore, the word-line control elements 6 have no effect on the signal level of the word lines controlled by the word-line drivers 2 and the redundant word-line driver 3. Subsequently, the above-mentioned processing is repeated.

As described above, in the case of no break in the word line, the operations of the semiconductor memory device of this embodiment are same as those in the prior art.

Next, the case where a break A occurs in the word line will be explained.

The word line with the break A (WL1 in FIG. 1) is replaced with the redundant word line RWL by redundancy repair. The word line WL1 with the break A is made to be L level (the input terminal of the word-line driver 2 connected to the word line WL1 is grounded) so that the memory cells 1 connected to the word line WL1 go into a deactivated state (high-impedance state).

When all of the word-line drivers 2 and the redundant-word-line driver 3 output the word-line control signals WLCG 1 to WLCG3 of L level, all memory cells 1 go into a high-impedance state (the state in which no data input/output is performed). Next, the bit-line precharge control signal PCG (output signal of the bit-line precharge control signal line driver 4) becomes L level and the bit-line precharge circuits 5 go into an activated state. All pairs of bit lines BL and /BL are precharged to H level (VDD level) by the bit-line precharge circuits 5. At this time, the bit-line precharge control reverse signal /PCG becomes H level by the inverter 7 and gates of all word-line control elements 6 turn ON so that all of the word lines WL1, WL2 and the redundant word line RWL become L level. Since all of the word-line drivers 2 and the redundant word-line driver 3 output L level at this time, the output signals of the word-line control elements 6 do not conflict with signals of the word-line drivers 2 and the redundant word-line driver 3. Even if the break A occurs in the word line WL1, when word-line control elements 6 are in an activated state, right side from the break point A of the word line WL1 also becomes L level. As a result, going into a floating state is prevented.

When the bit-line precharge control signal PCG becomes H level, all bit-line precharge circuits 5 go into a deactivated state (high-impedance state).

When any one of all of the word-line drivers 2 and the redundant word-line driver 3 outputs H level, the memory cells 1 to which H level is inputted through the word line WL or the redundant word line RWL become activated (writing or reading of data is carried out). At this time, since the bit-line precharge control reverse signal /PCG is L level, gates of the word-line control elements 6 connected to all word lines including the redundant word line is OFF (high-impedance state). Therefore, the word line WL1 goes into a floating state on the right side from the break A (the word line WL1 is made to be L level on the left side from the break A by the word-line driver 2). However, during the immediately preceding period when the pairs of bit lines BL and /BL are precharged to H level, the word line WL1 on the right side from the break A has been discharged to L level by the word-line control element 6. Therefore, during the period when any other word line becomes H level (the bit-line precharge control signal PCG becomes H level), there is no possibility that potential of the word line WL1 on the right side from the break A rises to the threshold level of gates of the access transistors Q1 and Q2 of memory cell 1 or more.

Therefore, even if the break A occurs in the word line WL1, only the access transistors Q1 and Q2 of the memory cells 1 connected to any other word line of H level turn ON, and writing or reading data to/from the latch circuit Q3 to Q6 is performed through the pair of bit lines BL and /BL connected to the access transistors Q1 and Q2, respectively (the memory cells 1 are activated).

When writing or reading data to/from the memory cells 1 is completed, the word-line control signal of H level returns to L level and the memory cells 1 go into a deactivated state (high-impedance state). The bit-line precharge control signal PCG becomes L level again and the bit-line precharge circuits 5 are activated, so that all pairs of bit lines BL and /BL are precharged to H level (VDD level). At this time, the bit-line precharge control reverse signal /PCG becomes H level by the inverter 7 and gates of all word-line control elements 6 turn ON so that all of the word lines WL1, WL2 and the redundant word line RWL become L level. Even if the break A occurs in the word line WL1, the word line WL1 also becomes L level on the right side from the break point A by the word-line control element 6, and is prevented from going into a floating state. Since all of the word-line drivers 2 and the redundant word-line driver 3 output L level, the output signals of the word-line control elements 6 do not conflict with those of all of the word-line drivers 2 and the redundant word-line driver 3. Subsequently, the above-mentioned processing is repeated.

In order to repair the break defect in the word line certainly, the word-line control element 6 is connected to all word lines including the redundant word line at the remotest point from one end of the word line connected to the word-line driver 2 or the redundant word-line driver 3 (a far end of the word line et al., the other end). Unless the word-line control element 6 is connected to a far end of the word line or the redundant word line, in the case where the break occurs in the word line between the connecting point with the word-line control element 6 and the far end of the word line or the redundant word line, it is impossible to repair the semiconductor memory device.

For facilitating the explanation of concept of the present invention, although the semiconductor memory device in FIG. 1 consists of small number of memory cells, pairs of bit-lines, word-line drivers, redundant word-line driver, word lines, redundant word line, word line control elements and so on, the number of each device may be plural (or numerous) and there causes no change in effect from the embodiment.

As described above, in the semiconductor memory device according to present invention, by connecting the word-line control element controlled by the bit-line precharge control signal at far ends of the all word lines including the redundant word line (the remotest point from the connecting end of the word-line driver), data conflict between the memory cells connected to the word line with the break and the memory cells connected to the normal word line via the pair of bit lines is prevented from occurring, and a pass-through current between the memory cell connected to the word line with break and the bit-line precharge circuit is prevented from flowing during the period when the pair of bit lines are precharged. Therefore, defect of word line due to break can be repaired at a high probability.

Since all word-line control elements are controlled by the common signal (bit-line precharge control reverse signal), there is no increase in wiring densities in the semiconductor memory device. For instance, the semiconductor memory device of the present invention is easier to design its metal wiring pattern than the semiconductor memory device in which a word-line driver is connected to both ends of all of the word lines and the redundant word line.

<<Embodiment 2>>

Figure 2:
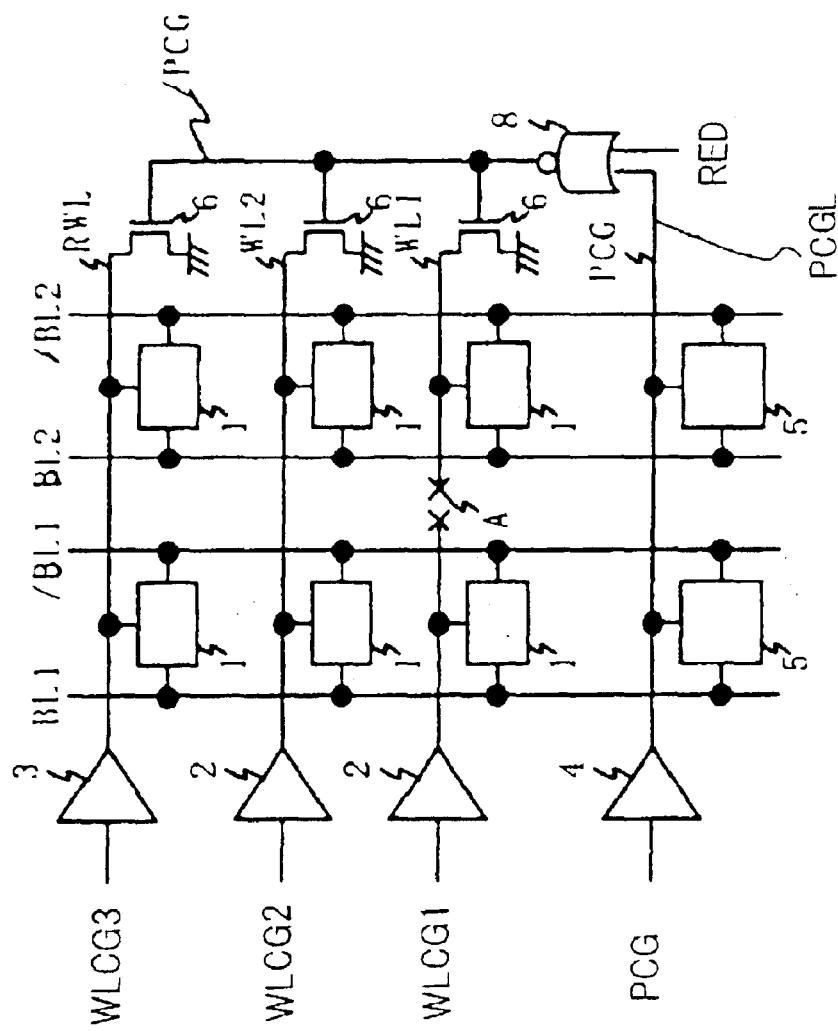
FIG. 2 is a configuration view of a semiconductor memory device of Embodiment 2 according to the present invention.

FIG. 2 shows a configuration view of a semiconductor memory device (SRAM) of Embodiment 2 according to the invention.

The semiconductor memory device shown in FIG. 2 has memory cells 1, word-line drivers 2, a redundant word-line driver 3, a bit-line precharge control signal line driver 4, bit-line precharge circuits 5, word-line control elements 6, an NOR circuit 8, word lines WL1 and WL2, a redundant word-line RWL, pairs of bit lines BL1, /BL1 and BL2, /BL2, and a bit-line precharge control signal line PCGL.

WLCG1 to WLCG 3, PCG, /PCG and RED designate word-line control signals, a bit-line precharge control signal, a bit-line precharge control reverse signal, and a redundant selection signal, respectively and mark A indicates a break in the word line.

FIG. 8 is a circuit diagram showing the specific configuration of the memory cell 1, and FIG. 9 shows a diagram showing the specific configuration of the bit-line precharge circuit 5. Each word-line control element 6 is connected to the remotest point (a far end) from one end of the word line (including the redundant word line) to which the word-line drivers 2 and the redundant word-line driver 3 are each connected.

The semiconductor memory device of this embodiment has the configuration in which the inverter 7 in the semiconductor memory device of Embodiment 1 is replaced with the NOR circuit 8 controlled by the bit-line precharge control signal PCG and the redundant selection signal RED.

Operations of the semiconductor memory device of this embodiment thus constituted will be described below.

In Embodiment 1, as the bit-line precharge control signal PCG changes, the bit-line precharge control reverse signal /PCG changes concurrently. However, in the case where no-break occurs in all word lines, it is acceptable that the word-line control element 6 remains deactivated state (OFF state). Thus, the bit-line precharge control reverse signal /PCG need not change and may be fixed at L level.

For this reason, the bit-line precharge control reverse signal is controlled by the NOR circuit 8 which receives input of the redundant selection signal RED, which outputs H level in the case of absence of the break defect in the word lines and outputs L level in the case of presence of the break defect in the word lines (in the case of using the redundant word line), and the bit-line precharge control signal PCG. That is, only when both of the bit-line precharge control signal PCG and the redundant selection signal RED become L level, the bit-line precharge control reverse signal /PCG becomes H level and the all word-line control elements 6 go into an activated state (ON state) so that all word lines become L level.

In the case where the break occurs in the word line, the NOR circuit 8 plays the same role as the inverter. The circuit diagram of this embodiment as shown in FIG. 2 performs the same operations as that of Embodiment 1 as shown in FIG. 1.

In the case where no break occurs in the word line, the redundant selection signal RED outputs H level. As a result, the bit-line precharge control reverse signal /PCG is fixed at L level and the all word-line control elements 6 remain deactivated state (OFF state).

Further, as explained in Embodiment 1, in order to repair the break defect in the word line certainly, the word-line control elements 6 are connected to all word lines including the redundant word line at the remotest points from one ends of the word lines connected to the word-line drivers 2 or the. redundant word-line driver 3 (a far end of the word line et al.).

For facilitating the explanation of concept of the present invention, although the semiconductor memory device in FIG. 2 consists of small number of memory cells, pairs of bit-lines, word-line drivers, redundant word-line driver, word lines, redundant word line, word line control elements and so on, the number of each device may be plural (or numerous) and there causes no change in effect from the embodiment.

As described above, in the semiconductor memory device according to this embodiment, in the absence of the break defect in the word line, change in the bit-line precharge control reverse signal is eliminated by the redundant selection signal. Generation of any charging and discharging current of the bit-line precharge control reverse signal is prevented, thereby achieving lower power consumption in the semiconductor memory device.

<<Embodiment 3>>

Figure 3:
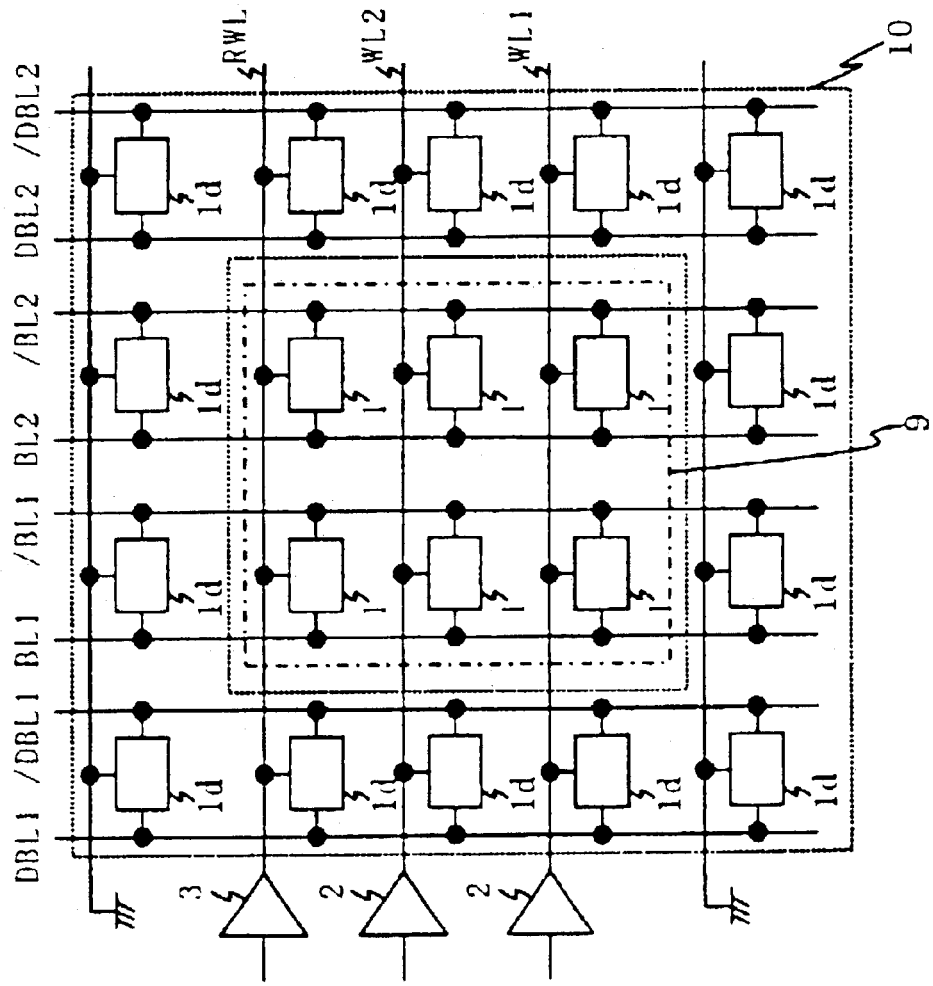
FIG. 3 is a configuration view showing a memory cell array of a semiconductor memory device of Embodiment 3 according to the present invention.

FIG. 3 shows a configuration view of a semiconductor memory device (SRAM) of Embodiment 3 according to the invention.

The semiconductor memory device shown in FIG. 3 has memory cells 1, dummy memory cells 1d, word-line drivers 2, a redundant word-line driver 3, a memory cell array 9, a dummy memory cell array 10, word lines WL1 and WL2, a redundant word-line RWL, pairs of bit lines BL1, /BL1 and BL2, /BL2, and pairs of dummy bit lines DBL1, /DBL1 and DBL2, /DBL2 (a bit-line precharge circuit 5 and so on are not shown).

The specific circuit configuration of the memory cell 1 in FIG. 3 is identical to that in FIG. 8.

Recently, in semiconductor memory devices, it is generally configured so as to place the dummy memory cell array 10 on the periphery of the memory cell array 9 as shown in FIG. 3 so that the shape of memory cell array is stably made with fine processing. Generally, the dummy memory cell 1d has the same configuration as the memory cell 1. The dummy memory cell 1d is only disposed on the periphery of the memory cell array 9. As distinct from the memory cell 1, the dummy memory cell 1d is not used for storing and holding data and has no relation to operations of the circuit.

Figure 4:
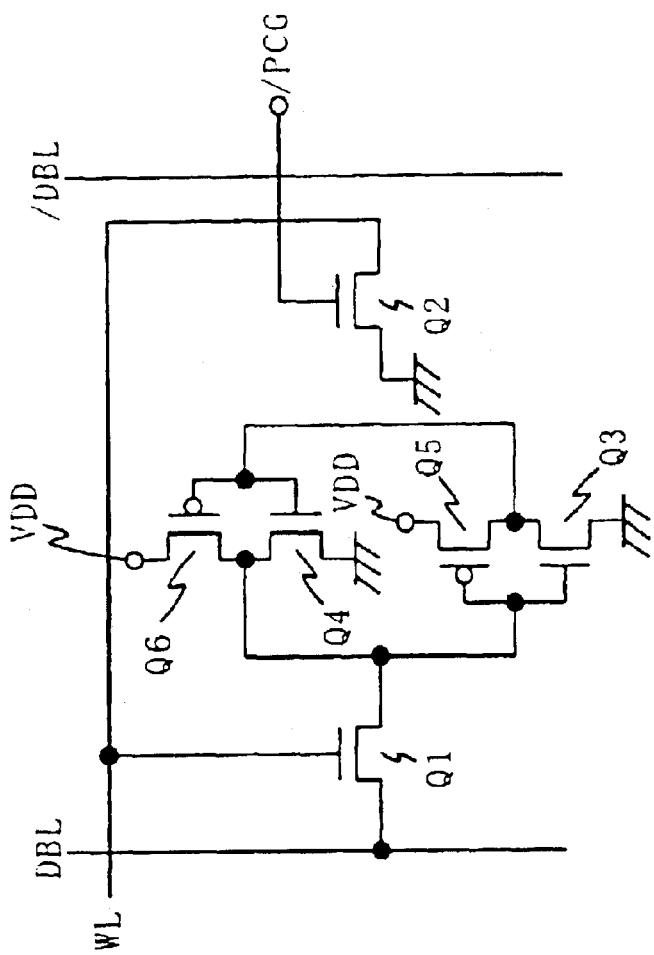
FIG. 4 is an example of a specific configuration in which a word-line control device is configured by using a dummy memory cell of the semiconductor memory device of Embodiment 3 according to the present invention.

FIG. 4 is an example of the specific circuit diagram showing the dummy memory cell in the semiconductor memory device of Embodiment 3. The semiconductor memory device of this embodiment is characterized by using one of the access transistors of the dummy memory cell as a bit-line control element.

In FIG. 4, Q1 is an access transistor, Q3 and Q4 are drive transistors, Q5 and Q6 are load transistors, and WL, DBL and /DBL, and VDD designate word line, pair of dummy bit lines, and power source terminal, respectively.

Transistor Q2, which normally serves as an access transistor, is used as a bit-line control element.

The gate terminal of the access transistor Q2 receives input of the bit-line precharge control reverse signal /PCG, while drain terminal and source terminal thereof are each connected to the word line WL and ground, respectively. With such a configuration, the word-line control element can be constructed using the dummy memory cell 1d. Preferably, by means of only modification of metal wiring, such as aluminum wiring, without changing pattern of semiconductor substrate, the access transistor Q2 can be transformed to the bit-line control element. This causes no damage to the stability in processing the shape of the memory cell array, even when the access transistor Q2 is used as the bit-line control element.

As described above, it is possible to suppress increase in layout area by using one of transistors which constitute the dummy memory cell 1d in FIG. 3 as the word-line control element 6 as shown in Embodiments 1 and 2.

<<Embodiment 4>>

Figure 5:
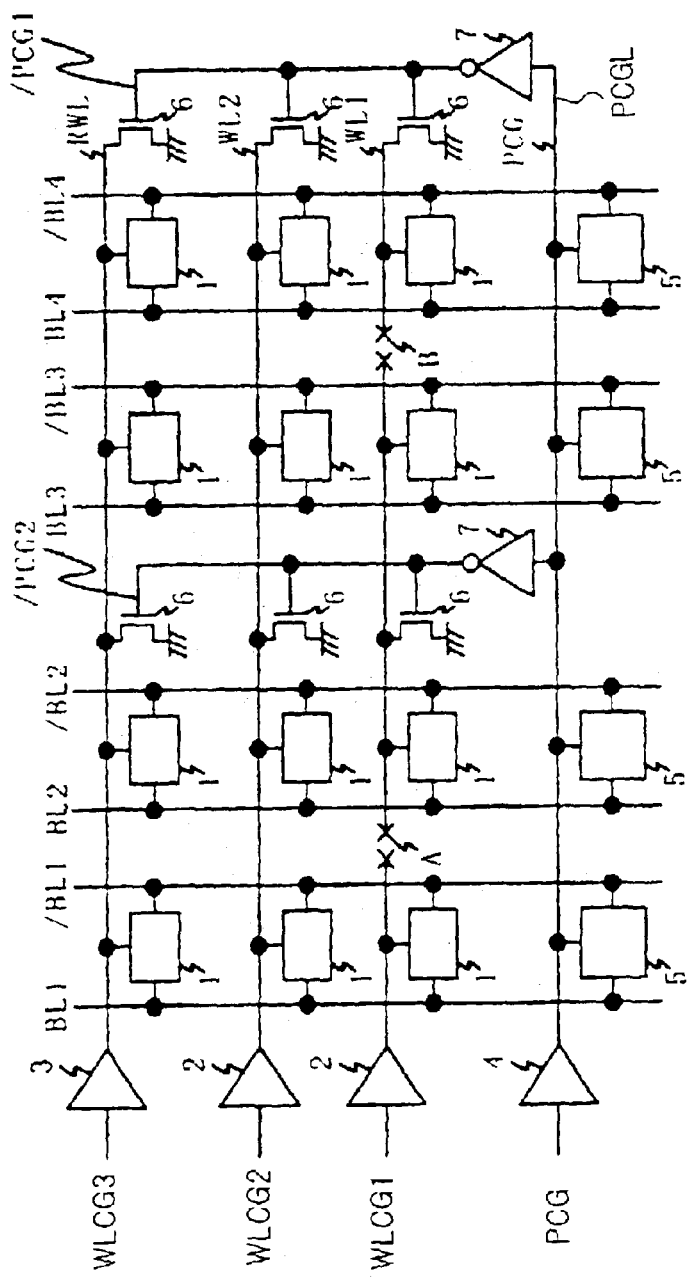
FIG. 5 is a configuration view of a semiconductor memory device of Embodiment 4 according to the present invention.

FIG. 5 shows a configuration view of a semiconductor memory device (SRAM) of Embodiment 4 according to the invention.

The semiconductor memory device shown in FIG. 5 has memory cells 1, word-line drivers 2, a redundant word-line driver 3, a bit-line precharge control signal line driver 4, bit-line precharge circuits 5, word-line control elements 6, inverters 7, word lines WL1 and WL2, a redundant word-line RWL, pairs of bit lines BL1 to BL4 and /BL1 to /BL4 and a bit-line precharge control signal line PCGL.

WLCG1 to WLCG 3, PCG, and /PCG1, /PCG2 designate word-line control signals, a bit-line precharge control signal, a bit-line precharge control reverse signal, respectively. Marks A and B indicate that the breaks occur at plural points in the same word line.

FIG. 8 is a circuit diagram showing the specific configuration of the memory cell 1, and FIG. 9 shows a diagram showing the specific configuration of the bit-line precharge circuit 5.

The semiconductor memory device of this embodiment has the similar configuration to that of Embodiment 1. In Embodiment 1, the word-line control element 6 is connected to the word line only at the remotest point (a far end) from one end of the word line to which the word-line driver 2 or the redundant word-line driver 3 is connected. Meanwhile, in this embodiment, the word-line control element is connected to the word line also at a point other than both ends of the word line (at a point other than one end of the word line to which the word-line driver 2 or the redundant word-line driver 3 and the far end).

As shown in FIG. 5, plural inverters 7 receive input of the bit-line precharge control signal and output the bit-line precharge control reverse signals /PCG1 and /PCG2, respectively. Each word-line control element 6 is controlled by the bit-line precharge control reverse signal /PCG1 or /PCG2. Operations of each word-line control element 6 are identical to the operations in Embodiment 1.

Operations of the semiconductor memory device in this embodiment thus constituted will be described below.

With the circuit configuration in Embodiments 1 and 2, the case where the break occurs at only one point in one word line (A in FIG. 1) can be addressed, while the case where the breaks occur at plural points in one word line as shown in FIG. 5 cannot be addressed. In other words, in FIG. 5, supposed the word-line control elements 6 controlled by the bit-line precharge control reverse signal /PCG2 are not connected, the word line goes into a floating state between the breaks A and B. As a result, there is a possibility that conflict between memory cells occurs, resulting in destroying data of the memory cell 1 connected to the normal word line, and a pass-through current flows between the memory cell and the bit-line precharge circuit during the period when the pair of bit lines are precharged.

This embodiment describes the case where the breaks occur at two points in the same word line as shown in FIG. 5. In the case where the breaks occur at three or more points in the same word line, the word-line control elements 6 are connected at the far ends of all word lines including the redundant word line and plural points other than both ends of the word lines, so that the above-mentioned problem can be solved at a higher probability.

For facilitating the explanation of concept of the present invention, although the semiconductor memory device in FIG. 5 consists of small number of memory cells, pairs of bit-lines, word-line drivers, redundant word-line driver, word lines, redundant word line, word line control elements and so on, the number of each device may be plural (or numerous) and there causes no change in effect from the embodiment.

As described above, in the semiconductor memory device according to the present invention, by connecting the word-line control elements controlled by the bit-line precharge control signal to far ends and one or more points other than both ends of the all word lines including the redundant word line, data conflict between the memory cells connected to the word line with the breaks at plural points and the memory cells connected-to the normal word line via the pair of bit lines is prevented from occurring, and a pass-through current between the memory cell connected to the word line with breaks at plural points and the bit-line precharge circuit is prevented from flowing during the period when the pair of bit lines are precharged. Therefore, defect of word line due to break can be repaired at a higher probability.

It is possible to suppress increase in layout area by combining this embodiment and Embodiment 3 and using one of transistors (transistors Q1 to Q6) which constitute the dummy memory cell 1d in FIG. 3 as the word-line control element 6.

<<Embodiment 5>>

Figure 6:
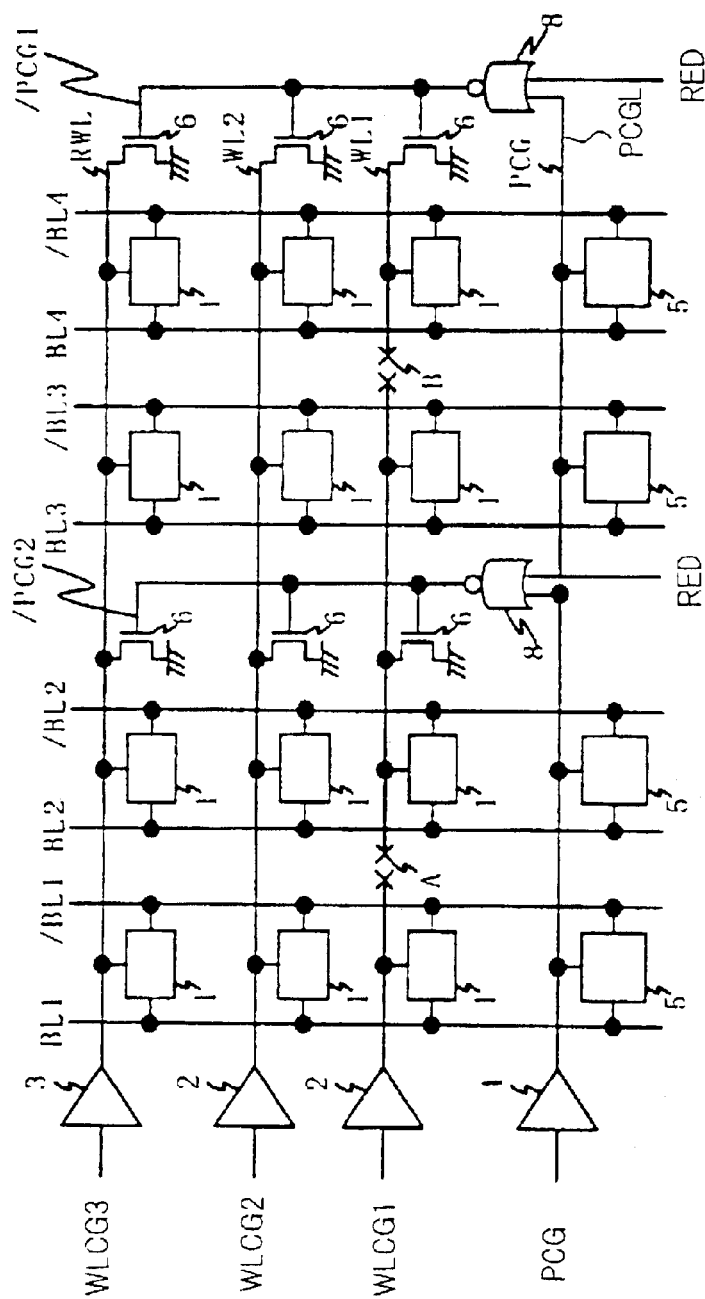
FIG. 6 is a configuration view of a semiconductor memory device of Embodiment 5 according to the present invention.
Figure 7:
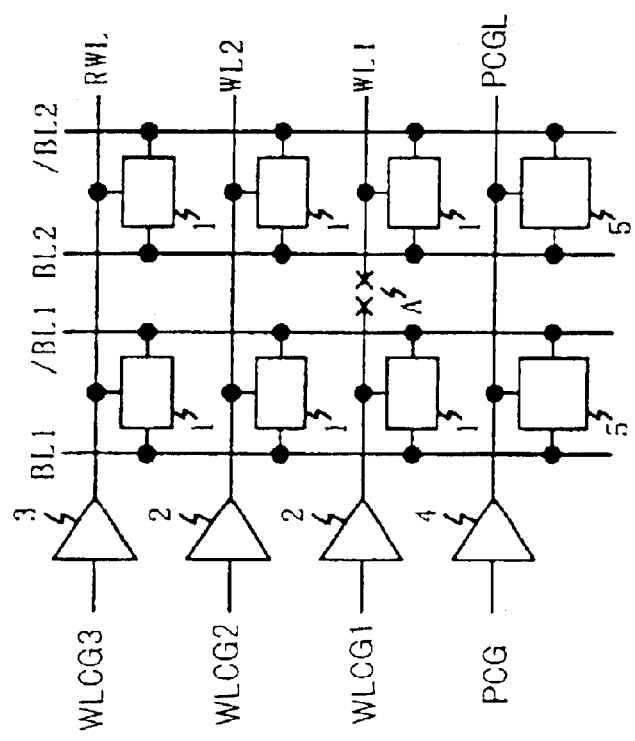
FIG. 7 is a configuration view of a prior art semiconductor memory device.

FIG. 6 shows a configuration view of a semiconductor memory device (SRAM) of Embodiment 5 according to the invention.

The semiconductor memory device shown in FIG. 6 has memory cells 1, word-line drivers 2, a redundant word-line driver 3, a bit-line precharge control signal line driver 4, bit-line precharge circuits 5, word-line control elements 6, NOR circuits 8, word lines WL1 and WL2, a redundant word-line RWL, pairs of bit lines BL1 to BL4 and /BL1 to /BL4 and a bit-line precharge control signal line PCGL.

WLCG1 to WLCG 3, PCG, and /PCG1, /PCG2 designate word-line control signals, a bit-line precharge control signal, a bit-line precharge control reverse signal, respectively. Marks A and B indicate that the breaks occur at plural points in the same word line.

FIG. 8 is a circuit diagram showing the specific configuration of the memory cell 1, and FIG. 9 shows a diagram showing the specific configuration of the bit-line precharge circuit 5.

The semiconductor memory device of this embodiment has the similar configuration to that of Embodiment 2. In Embodiment 2, the word-line control element 6 is connected to the word line only at the remotest point (a far end) from one end of the word line to which the word-line driver 2 or the redundant word-line driver 3 is connected. Meanwhile, in this embodiment, the word-line control element is connected to the word line also at any point other than the remotest point (a far end) from one end to which the word-line driver 2 or the redundant word-line driver 3 is connected (at any point other than both ends of the word line).

The semiconductor memory device of this embodiment as shown in FIG. 6 has the configuration in which the inverter 7 in the semiconductor memory device of Embodiment 4 as shown in FIG. 5 is replaced with the NOR circuit 8 controlled by the bit-line precharge control signal PCG and the redundant selection signal RED.

Operations of the semiconductor memory device of this embodiment thus constituted will be described below.

In Embodiment 4, as the bit-line precharge control signal PCG changes, the bit-line precharge control reverse signal /PCG changes concurrently. However, in the case where no break occurs in all word lines, it is acceptable that the word-line control elements 6 remain deactivated state. Thus, the bit-line precharge control reverse signal /PCG need not change and may be fixed at L level.

For this reason, in this embodiment, the bit-line precharge control reverse signal is controlled by the NOR circuit 8 which receives input of the redundant selection signal RED which outputs H level in the case of absence of break in the word line and outputs L level in the case of presence of break in the word line, and the bit-line precharge control signal PCG. That is, only when both of the bit-line precharge control signal PCG and the redundant selection signal RED become L level, the bit-line precharge control reverse signal /PCG becomes H level and the all word-line control elements 6 go into an activated state so that all word lines become L level.

In the case where the break occurs in the word line (the redundant selection signal RED becomes L level), the NOR circuit 8 plays the same role as the inverter. The circuit diagram of this embodiment as shown in FIG. 6 performs the same operations as that of Embodiment 4 as shown in FIG. 5.

In the case where no break occurs in the word line, the redundant selection signal RED outputs H level. As a result, the bit-line precharge control reverse signals /PCG1 and /PCG2 are fixed at L level and the all word-line control elements 6 go into a deactivated state (high-impedance state).

This embodiment describes the case where the break occurs at two points in the same word line as shown in FIG. 6. In the case where the break occurs at three or more points in the same word line, by connecting the word-line control elements at the far ends of all word lines including the redundant word line and plural points other than both ends of the word lines, it is possible to solve the above-mentioned problems (data conflicts between memory cells, resulting in destroying data and pass-through current flows during the period when the pair of bit lines are precharged) at a higher probability.

For facilitating the explanation of concept of the present invention, although the semiconductor memory device in FIG. 6 consists of small number of memory cells, pairs of bit-lines, word-line drivers, redundant word-line driver, word lines, redundant word line, word line control elements and so on, the number of each device may be plural (or numerous) and there causes no change in effect from the embodiment.

As described above, in the semiconductor memory device according to the present invention, in the absence of break in the word line, change in the bit-line precharge control reverse signal is eliminated by the redundant selection signal. This prevents flow of any charging and discharging current of the bit-line precharge control reverse signal, thereby achieving lower power consumption in the semiconductor memory device.

It is possible to suppress increase in layout area by combining this embodiment and Embodiment 3 and using one of transistors (transistors Q1 to Q6) which constitute the dummy memory cell 1d in FIG. 3 as the word-line control element 6.

Although the semiconductor memory device in these embodiments is SRAM, it is not limited to SRAM, and may be, for instance, DRAM.

As described above, in the semiconductor memory device according to the present invention, by connecting the word-line control elements controlled by the bit-line precharge control signal to far ends of the all word lines including the redundant word line, data conflict between the memory cell connected to the word line with the break and the memory cell connected to the normal word line via the pair of bit lines is prevented from occurring, and a pass-through current between the memory cell connected to the word line with the break and the bit-line precharge circuit is prevented from flowing during the period when the pair of bit lines are precharged. This enables to securely repair defect of word line due to break in the semiconductor memory device.

In the semiconductor memory device according to the present invention, by connecting the word-line control elements controlled by the bit-line precharge control signal to far ends and one or more points other than both ends of the all word lines including the redundant word line, data conflict between the memory cell connected to the word line with the breaks at plural points and the memory cell connected to the normal word line via the pair of bit lines is prevented from occurring, and a pass-through current between the memory cell connected to the word line with the breaks at plural points and the bit-line precharge circuit is prevented from flowing during the period when the pair of bit lines are precharged. This enables to improve the probability of being able to repair defect of word line due to break in the semiconductor memory device.

Further, in the absence of break in the word line, change in the bit-line precharge control reverse signal is eliminated by controlling the word-line control element with the redundant selection signal. This prevents flow of any charging and discharging current of the bit-line precharge control reverse signal, thereby achieving lower power consumption in the semiconductor memory device.

Furthermore, it is possible to suppress increase in layout area of the semiconductor memory device by constituting the word-line control element with the dummy memory cell.

Clearly, numerous modifications and variations of the instant invention are possible in light of the above teachings. It is therefore understood that, within the scope and spirit of the claims made herein, the invention may be practiced otherwise than as specifically described herein, the invention may be modified in arrangement and detail without departing from such scope and spirit and, further, the utility described herein is by way of example.

What is claimed:

1. A semiconductor memory device comprising:

plural word lines including one or more redundant word lines, plural pairs of bit lines, plural memory cells connected to said plural word lines and said plural pairs of bit lines, plural word-line drivers which are connected to one ends of said plural word lines and controlled by plural word-line control signals respectively, and plural word-line control elements which are connected to other ends of said plural word lines and controlled by a control signal activated at a precharge of said bit lines.

2. A semiconductor memory device in accordance with claim 1, wherein said plural word-line control elements are controlled by a precharge control signal and a redundant selection signal.

3. A semiconductor memory device in accordance with claim 1, wherein said plural word-line control elements are formed by using elements of dummy memory cells disposed on the periphery of a memory cell array which consists of said plural memory cells.

4. A semiconductor memory device comprising:

plural word lines including one or more redundant word lines, plural pairs of bit lines, plural memory cells connected to said plural word lines and said plural pairs of bit lines, plural word-line drivers which are connected to one ends of said plural word lines and controlled by plural word-line control signals respectively, plural first word-line control elements which are connected to other ends of said plural word lines respectively and controlled by a bit-line precharge control signal, and plural second word-line control elements which are connected to predetermined points other than both ends of said plural word lines and controlled by a control signal activated at a precharge of said bit lines.

5. A semiconductor memory device in accordance with claim 4, wherein said plural first word-line control elements and said plural second word-line control elements are controlled by a precharge control signal and a redundant selection signal.

6. A semiconductor memory device in accordance with claim 4, wherein said plural first word-line control elements and said plural second word-line control elements are formed by using elements of dummy memory cells.

* * * * *